(12) United States Patent
Walker (10) Patent No.: US 8,111,534 B2
(45) Date of Patent: Feb. 7, 2012

(54) RANK SELECT USING A GLOBAL SELECT PIN

(75) Inventor: Robert Walker, Raleigh, NC (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/109,852

(22) Filed: May 17, 2011

(65) Prior Publication Data
US 2011/0216570 A1    Sep. 8, 2011

Related U.S. Application Data

(62) Division of application No. 12/026,693, filed on Feb. 6, 2008, now Pat. No. 7,948,786.

(51) Int. Cl.
*G11C 5/00* (2006.01)
*G11C 7/00* (2006.01)
*G11C 8/00* (2006.01)
(52) U.S. Cl. ......... 365/51; 365/52; 365/63; 365/189.07; 365/230.03; 365/230.05; 365/236
(58) Field of Classification Search .................... 365/51, 365/52, 63, 189.07, 230.03, 230.05, 236
See application file for complete search history.

(56) References Cited

U.S. PATENT DOCUMENTS

| | | | |
|---|---|---|---|
| 4,833,648 A * | 5/1989 | Scharrer et al. ......... | 365/230.05 |
| 4,984,214 A | 1/1991 | Hiltebeitel et al. | |
| 4,987,559 A | 1/1991 | Miyauchi et al. | |
| 5,140,686 A | 8/1992 | Cox et al. | |
| 5,303,201 A | 4/1994 | Sakamoto | |
| 5,442,770 A | 8/1995 | Barratt | |
| 5,523,979 A | 6/1996 | Nemazie | |
| 5,576,997 A | 11/1996 | Masuda et al. | |
| 5,594,702 A | 1/1997 | Wakerman et al. | |
| 5,680,425 A | 10/1997 | Morzano | |
| 5,943,287 A * | 8/1999 | Walton ..................... | 365/230.03 |
| 6,070,256 A * | 5/2000 | Wu et al. ................. | 365/230.05 |
| 6,137,710 A | 10/2000 | Iwasaki et al. | |
| 6,148,363 A | 11/2000 | Lofgren et al. | |
| 6,373,768 B2 | 4/2002 | Woo et al. | |
| 6,542,393 B1 | 4/2003 | Chu et al. | |
| 6,563,751 B1 * | 5/2003 | Wu .......................... | 365/230.05 |
| 6,742,088 B1 * | 5/2004 | Wielage et al. .......... | 365/230.05 |
| 6,834,014 B2 | 12/2004 | Yoo et al. | |

(Continued)

FOREIGN PATENT DOCUMENTS
JP    62075852    7/1987

*Primary Examiner* — Trong Phan
(74) *Attorney, Agent, or Firm* — Fletcher Yoder (57) ABSTRACT

Methods, memory devices, and systems are disclosed, such as those for accessing a memory circuit through the use of reduced external pins. With one such system, a single external pin receives a global memory select signal which transmits an access signal for one of a plurality of memory circuits in a system. The memory circuits may be stacked and may also be ranked memory circuits. The global memory select signal may be sent to a counter. Such a counter could count the length of time that the global memory select signal is active, and based on the counting, sends a count signal to a comparator. The comparator may compare the count signal with a programmed value to determine if a specific memory chip and/or port is to be accessed. This configuration may be duplicated over multiple ports on the same memory device, as well as across multiple memory ranks.

20 Claims, 8 Drawing Sheets

U.S. PATENT DOCUMENTS

| | | |
|---|---|---|
| 6,976,121 B2 | 12/2005 | Khandekar et al. |
| 7,099,219 B2 * | 8/2006 | Hsu et al. ................. 365/230.05 |
| 7,126,873 B2 | 10/2006 | See et al. |
| 7,200,021 B2 | 4/2007 | Raghuram |
| 7,266,639 B2 | 9/2007 | Raghuram |
| 7,269,042 B2 | 9/2007 | Kinsley et al. |
| 7,269,043 B2 | 9/2007 | Lee |
| 7,522,468 B2 | 4/2009 | Norman |
| 7,613,065 B2 | 11/2009 | Chung |
| 7,710,754 B2 | 5/2010 | Kao |

* cited by examiner

RANK SELECT USING A GLOBAL SELECT PIN

CROSS-REFERENCE TO RELATED APPLICATION

This application is a divisional of U.S. patent application Ser. No. 12/026,693, which was filed on Feb. 6, 2008, now U.S. Pat. No. 7,948,786, which issued on May 24, 2011.

BACKGROUND

1. Field of the Invention

Embodiments of the invention relate generally to a reduction of pins required to utilize and to select a memory rank.

2. Description of the Related Art

Demands for memory capacity continue to increase in modern electronics. At the same time, size of circuitry is at an increased premium as devices which utilize memory circuitry continue to shrink. One solution as to how to increase memory capacity while minimizing the amount of space required in implementing memory circuitry has involved the development of dual inline memory modules (DIMMs). DIMM chips allow for placement of memory chips on both sides of a printed circuit board. In this manner, the amount of memory chips accessible by a device may be doubled while using the same sized printed circuit board.

A second solution as to how to increase memory capacity while minimizing the amount of space required in implementing memory circuitry has involved the development of memory stacking. Memory stacking involves placing memory dies on top of each other, while sharing a common printed circuit board. Typically, the dies are packaged together into a single memory chip. The memory dies in the memory chip are typically referred to by rank. That is, a memory chip containing two memory dies in a single package has two ranks of memory. Thus, a DIMM containing two memory chips, each containing two memory dies, has four ranks of memory. The total number of memory ranks in a memory circuit is referred to as the memory density of the memory circuit.

The stacked memory dies in the memory chip are individually connected to a memory substrate. The memory substrate typically utilizes solder balls, bond wires, or leads to connect to a printed circuit board for connection of the memory chip to the electronic device. These connections between the circuit board and the memory chip may be termed "pins". Through these pins, a device may access a large group of memory dies while minimizing the amount of board space required to interface with the printed circuit board on which the memory dies reside.

The pins, e.g., a lead, such as a metal wire, enable the memory chips to transmit signals to and receive signals from the printed circuit board. When adding ranks of memory, traditionally a pin has been added to address the additional rank. This pin is commonly known as a chip select (CS). Thus, if a chip included two ranks of memory, two CS pins would be employed to access the ranks. Additionally, memory chips may include a plurality of ports. Multi-port memory is capable of supporting simultaneous access. In addition to allowing simultaneous reads and writes, multi-port memory may allow for access from varied bus width inputs. When adding ranks of memory that have multiple ports, traditionally multiple port select (PS) pins are typically added. Thus, if a chip included a single memory die with four ports, four PS pins would be employed to access the memory chip. Similarly, if a DIMM included four stacked multi-port memory dies, each with four ports per memory die, then 16 PS pins would be employed to access the memory chips.

In certain devices, input/output (I/O) pin counts are at a premium. In these devices, adding multiple CS or PS pins becomes very expensive as the density of a memory circuit increases. Similarly, there are devices which may have fixed pin requirements, but that require more memory capacity than that which may be delivered across a system utilizing a single pin-per-rank or a single pin-per-port configuration. Thus, there is a need for a multi-rank and multi-port memory which may be accessed by a reduced number of pins. Embodiments of the invention may be directed to one or more of the problems set forth above.

DETAILED DESCRIPTION OF SPECIFIC EMBODIMENTS

The present disclosure generally describes accessing multiple memory circuits with a single I/O pin. The memories may be multi-port memories, in which case a global Port Select pin may be the only I/O pin required to access multiple internal Port Select pins. The memories may also be single port memories, in which case a global Chip Select pin may be the only I/O pin required to access the internal Chip Select pins. In this manner, external pin counts may be kept to a minimum even as memory density increases because the memory circuits may be fully accessed through a single external I/O pin. One or more examples of specific embodiments of the present invention will be described below.

Figure 1:
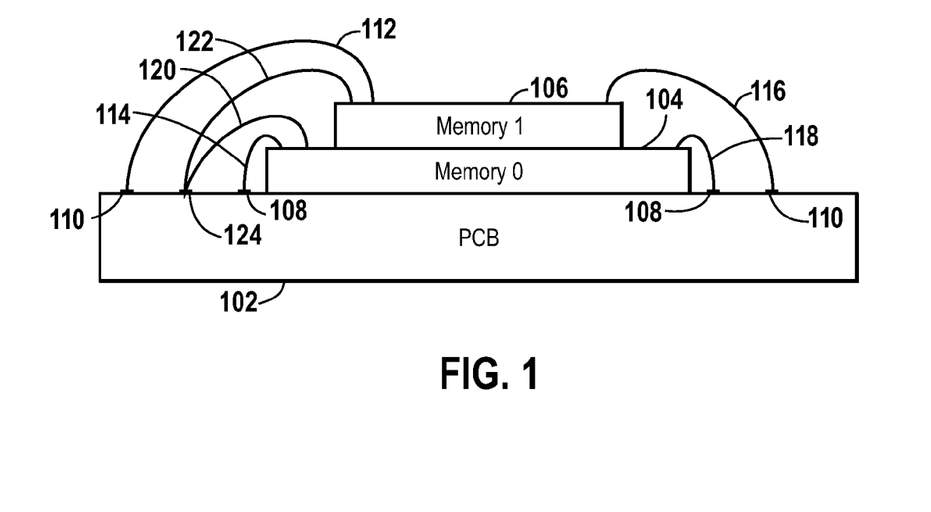
FIG. 1 is a side diagrammatical view of a printed circuit board with two memory dies stacked thereon.

Turning now to the drawings, and referring initially to FIG. 1, a stacked memory chip, generally designated by reference numeral 100, is illustrated. The stacked memory chip 100 includes a printed circuit board (i.e., PCB) 102. Printed circuit board 102 may typically be fabricated out of a non-conductive substrate material onto which electronic devices may be mounted. In the stacked memory chip 100, memory die 104 (i.e., Memory 0) and memory die 106 (i.e., Memory 1) are mounted to the printed circuit board 102. Memory dies 104 and 106 may be packaged within the same memory chip 100. Printed circuit board 102 also includes pads 108 and 110. Pads 108, 110, and 124 are locations at which memory die 104 and memory die 106 are electrically connected to the printed circuit board 102. For example, pad 124 may be connected to an external pin of both memory 104 and 106. This external pin may be an external "global pin" which may be used as a global chip select or a global pin select, as described further below. The global pins of memory 104 and memory 106 may be made up of bonding wires 112-122. Bonding wires 112-122 are conductive pathways coupled to the memory die 104 and 106 and may be coupled to printed circuit board 102 at pads 108, 110, and 124. The bonding wires 112-118 may, for example, be made from gold, aluminum, or copper. Memory die 104 and memory die 106 are illustrated to be in a stacked configuration. In this configuration, memory die 104 may be referred to as rank 0 while memory die 106 may be referred to as rank 1. While only two ranks of memory are illustrated, more memory dies may be stacked above memory die 104 and memory die 106. Furthermore, additional memory dies may stacked below the printed circuit board in a similar fashion to memory die 104 and memory die 106.

Figure 2:
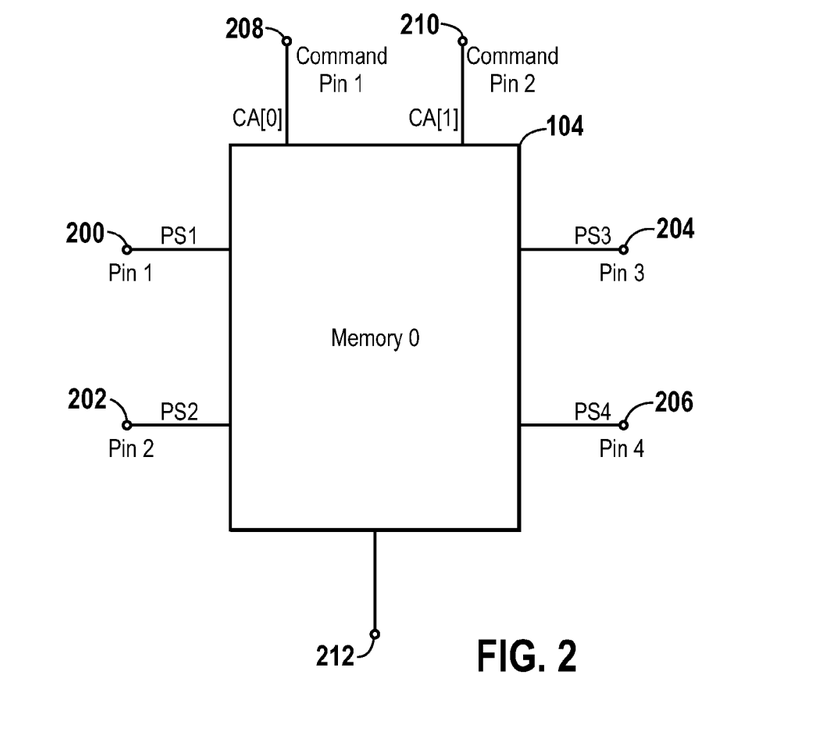
FIG. 2 is a block diagram of a multi-port memory die.

Turning now to FIG. 2, a block diagram of memory die 104 (i.e., Memory 0) is illustrated. Memory die 104 may be a multi-port memory. Multi-port memory is capable of supporting simultaneous access to different memories, such as different portions of memory die 104. In addition to allowing simultaneous reads and writes, multi-port memory may allow for access from varied bus width inputs. Memory die 104 includes four ports. Thus, memory die 104 also includes four port select (PS) pins (i.e., Pin 1 or PS1, Pin 2 or PS2, Pin 3 or PS3, and Pin 4 or PS4), 200-206, to access memory die 104, and as such may be characterized as a "single pin-per-port multi-port memory device." Memory die 104 also includes command ports. These command ports may be connected to command address pins 208 and 210. While only two command pins 208 and 210 have been illustrated, memory die 104 may have a set of two command pins per port select pin 200-206. Moreover, while two command address pins 208 and 210 have been illustrated, one or more than two command address pins may also be used with each port select pin 200-206. The command address pins may receive and transmit command and address signals to memory die 104. Command address pins 208 (i.e., Command Pin 1 or CA[0]) and 210 (i.e., Command Pin 2 or CA[1]) may receive and transmit signals at a rate greater than one bit at a time. In this manner, command address pins 208 and 210 may act as a parallel interface. Memory die 104 may also include a write strobe pin 212. Write strobe pin 212 accepts a write strobe signal which may act as a clock for memory die 104. PS pins 200-206, command address pins 208 and 210, and write strobe pin 212 may be input/output (I/O) pins.

Figure 3:
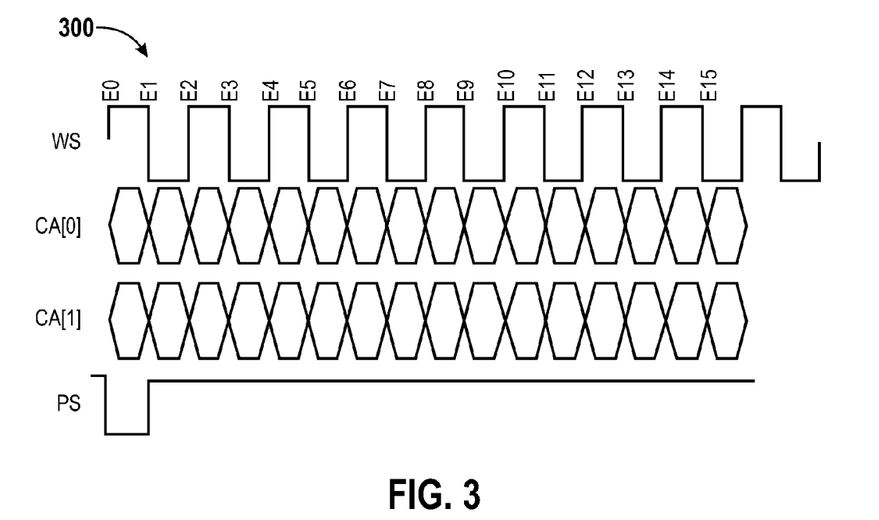
FIG. 3 is a timing diagram for a single pin-per-port multi-port memory device.

FIG. 3 is a timing diagram 300 for a single pin-per-port multi-port memory device such as memory die 104. In timing diagram 300, a single PS pin is to be activated, e.g. 200. The command address pins 208 and 210, as well as PS pin 200, are aligned with the write strobe (i.e., WS) pin 212. In the timing diagram 300, the command delivered to memory die 104 is decoded in 16 half-cycles (E0-E15). It should be noted that the 16 half-cycle decode time is provided as an illustrative example only, the total amount of half-cycles used for decoding the command may range from 2 to N. A low signal is transmitted to PS 200 to activate a specific portion of memory die 104. As the activation occurs, the write strobe pin 212 delivers an oscillating signal which acts as a clock for memory die 104. Command and address signals are sent, via command address pins 208 (i.e., CA[0]) and 210 (i.e., CA[1]), to the activated portion of memory die 104 as determined by the PS pin 200. In this manner, a single port may be accessed in the memory die 104. The same timing diagram may be used to represent accessing PS pins 202-206. Any port of memory die 104 may be selected by dropping the corresponding PS pin 200-206 to active low in the manner illustrated in timing diagram 300 and described above.

Figure 4:
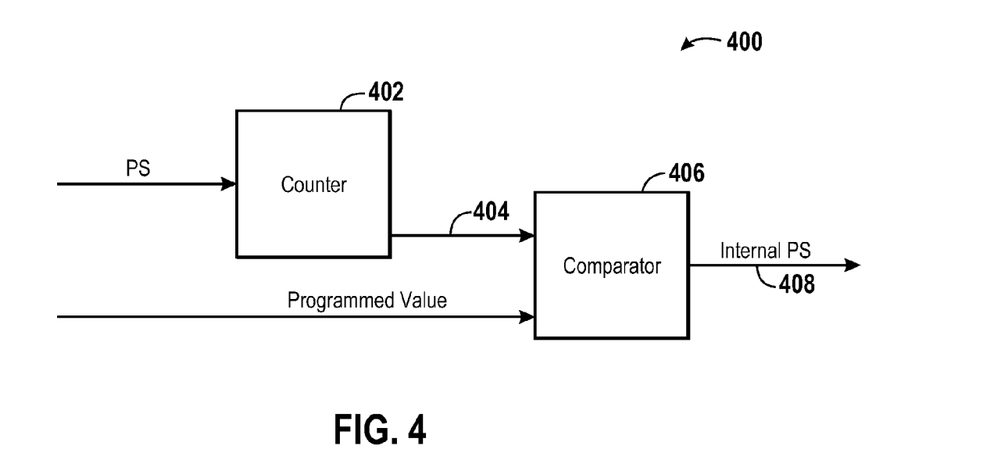
FIG. 4 is a block diagram of a first embodiment of a circuit used in selecting a single port of at least one memory die in a reduced I/O pin multi-port memory circuit.

FIG. 4 illustrates a block diagram of a first embodiment utilizing a comparison circuit 400 to reduce the number of I/O pins used to select a single port of a memory die in a reduced I/O pin multi-port memory circuit. FIG. 4 illustrates a counter 402. Counter 402 has as an input signal a PS signal issued from a global PS pin. Counter 402 counts the number of half-cycles that the PS signal is driven low. In this case, the PS signal is driven to an active low state for a period of time, however, it is envisioned that the PS signal could instead be driven to an active high state for a period of time. Counter 402 may have a write strobe signal transmitted from a global write strobe pin as an input for use in counting the number of half-cycles that the PS signal is driven low. Conversely, counter 402 may include internal clocking circuitry for counting the number of half-cycles that the PS signal is driven low. The counter 402 issues a result of the counting operation on line 404. The value of the result issued by the counter 402 may be equivalent to the number of half-cycles that the input PS signal is driven low. Comparator 404 receives the result issued by the counter 402 on line 404. Comparator 406 also receives a programmed value. The programmed value may issue from a pre-wired known value. In one embodiment, the programmed value may be set according to a fuse. In another embodiment, the programmed value may issue from a wire bond pad that is connected to an external voltage source. Through regulation of this external voltage source, the value transmitted to the comparator may be adjusted to the desired programmed value. The comparator 406 compares the result issued by the counter 402 on line 404 with the programmed value. If the values are equivalent, then the comparator issues an internal PS signal on the internal PS line 408. Internal PS line 408 may be coupled to an internal PS pin of a memory die. Thus, in one embodiment, there is a one-to-one correspondence between comparison circuit 400 and the total number of internal PS pins of a memory die.

Figure 5:
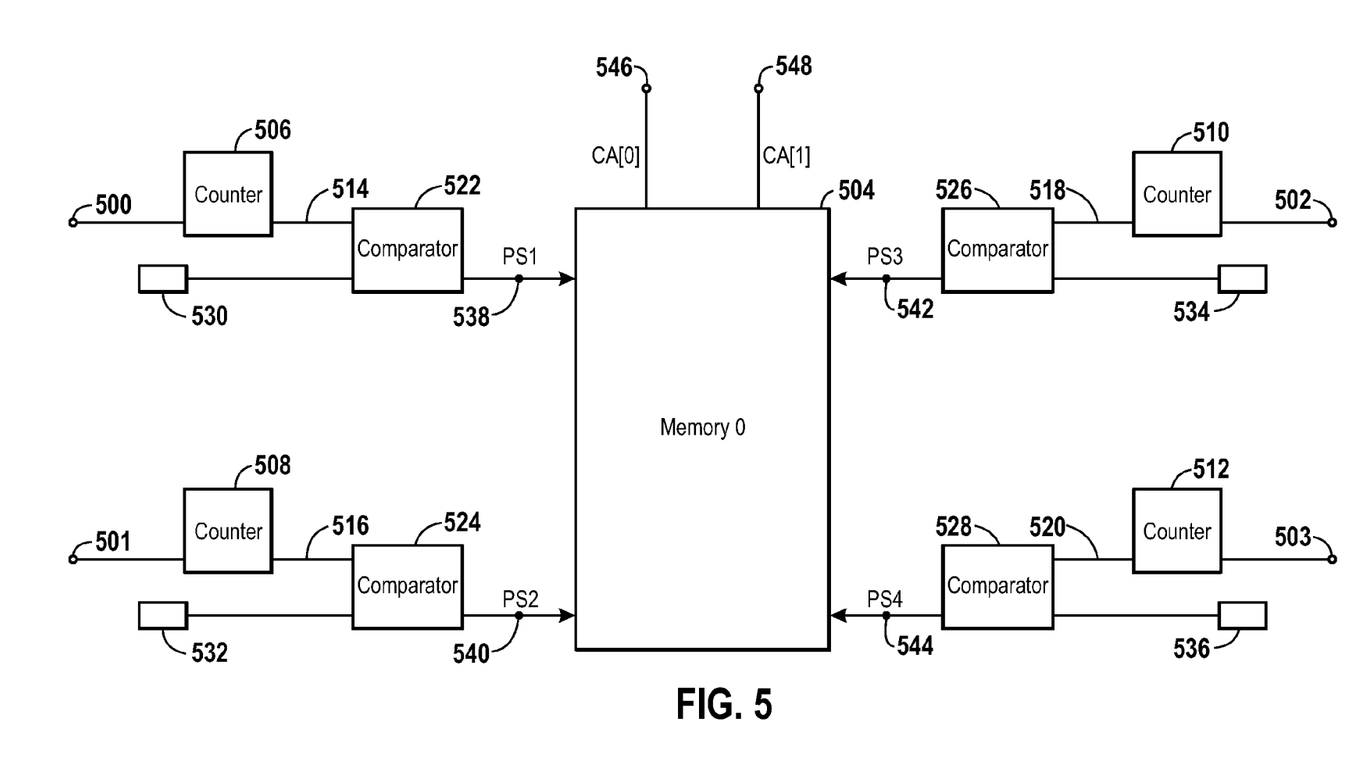
FIG. 5 is a block diagram illustrating a first embodiment of circuitry used in selecting a port in a reduced I/O pin multi-port memory circuit.

This one-to-one correspondence between comparison circuits 400 and internal PS pins is illustrated in FIG. 5. FIG. 5 illustrates four global PS pins 500-503, each used to select a specified port of multi-port memory die 504 (i.e., Memory 0). Global PS pins 500-503 are I/O pins which transmit an input signals to counter circuitry 506-512. These input signals may be analogous to the input PS signal in comparison circuit 400. Global PS pins 500-503 are each capable of addressing multiple ranks of memory. Counters 506-512 count the number of half-cycles that the global PS signals are driven low. Counters 506-512 may have a global write strobe signal transmitted from a global write strobe pin as an input for use in counting the number of half-cycles that the global PS signals are driven low. Conversely, counters 506-512 may include internal clocking circuitry for counting the number of half-cycles that the global PS signals are driven low. The counters 506-512 issue the results of their counting operations on lines 514-520. The values of the results issued by the counters 506-512 may be equivalent to the number of half-cycles that the global PS signals are driven low. Comparators 522-528 receive the result issued by the counters 506-512 on lines 514-520. Comparators 522-528 also receive a programmed value issued from a pre-wired known value location 530-536. In one embodiment, the programmed value may be set according to a fuse. In another embodiment, the programmed value may be set by a signal on a wire bond pad. The comparators 522-528 compare the results issued by the counters 506-512 with the programmed values issued from pre-wired known value locations 530-536. If the values are equivalent, then the comparator 522-528 issues an internal PS signal to the corresponding internal PS pin (i.e., PS1, PS2, PS3, and PS4) 538-544. For example, if the global PS pin 500 issues an active low PS signal for one half-cycle of a write strobe signal, then comparator 522 would issue an internal PS signal to internal PS pin 538. Similarly, if global PS pin 502 issued an active low signal for three half-cycles of a write strobe signal, then comparator 526 would issue an internal PS signal to internal PS pin 542.

Thus, in one embodiment, there is a one-to-one correspondence between the number of comparator circuits 522-528 and the total number of ports to be selected by the global PS pins 500-503, regardless of rank. For example, for a stacked memory chip 100 with a rank of two, wherein each memory die included four ports, there would be eight comparison circuits, addressable by the four global PS pins 500-503. In this example, comparison circuits 522-528 would correspond to memory die 504 and four other comparison circuits (not illustrated) would correspond in a similar manner to the second memory die (not illustrated). As such, if the global PS pin 500 issues an active low PS signal for one half-cycle of a write strobe signal, then comparator 522 issues an internal PS signal to internal PS pin 538. Similarly, if global PS pin 502 issued an active low signal for two half-cycles of a write strobe signal, then the comparator coupled to the PS3 PS pin of the second memory die (not illustrated) would issue an internal PS signal to the corresponding internal PS pin of second memory die. In this manner, the internal PS pins of multiple multi-port memory dies may be accessed using only the amount of I/O pins required to access a single rank of multi-port memory.

Figure 6:
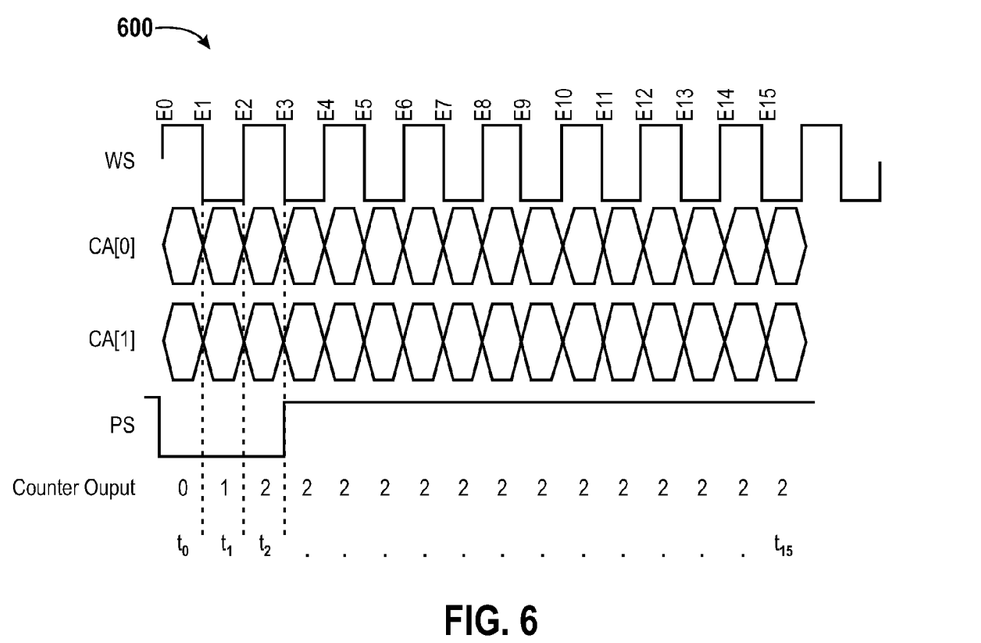
FIG. 6 is a timing diagram illustrating the operation of a reduced I/O pin multi-port memory circuit.

FIG. 6 is a timing diagram 600 illustrating the operation of a reduced I/O pin multi-port memory circuit, such as memory die 504. In timing diagram 300, a single PS pin is to be activated, e.g. 542. The command address pins 546 (i.e., CA[0]) and 548 (i.e., CA[1]), as well as global PS pin 502, are aligned with the write strobe (i.e., WS) signal. As noted above, although only two command address pins 546-548 are illustrated, as few one or more than two address pins per internal PS pin 538-544 may be used. In the timing diagram 600, the command delivered to memory die 504 is decoded in 16 half-cycles (E0-E15). As recited above, it should be noted that the 16 half-cycle decode time is provided as an illustrative example only, the total amount of half-cycles used for decoding the command may range from 2 to N. A low signal is transmitted by one of global PS pins 500-503 to activate a specific portion of memory die 504. In timing diagram 600, there is a counter output value (e.g., Counter Output 0, Counter Output 1, and Counter Output 2) shown for corresponding time periods (i.e., $t_0$, $t_1$, and $t_2$ . . . $t_{15}$) If, for example, the active low PS signal is sent from global PS pin 500 goes high at $t_0$, the counter 506 would output a zero as the counter value. This value would be transmitted on line 514 to comparator 522. Comparator 522 would also receive a programmed value from pre-wired known value locations 530. In the current example, pre-wired known value location 530 could be programmed with a zero so that comparator 522 would issue an internal PS signal to the corresponding internal PS pin 538. Similarly, for a memory stack with three ranks of memory, if the active low PS signal sent from the global PS pin 502 goes high at $t_2$, as shown in timing diagram 600, then the counters 506-510 and corresponding counters for memory die one and two (not pictured) would output a two as the counter value. This value would be transmitted on the lines 514-520 to comparators 522-528, as well to the comparators of memory die one and two. Comparators 522-528, as well as the comparators of memory die one and two, would also receive a programmed value from pre-wired known value locations 530-536, as well as the pre-wired known value locations of memory die one and two. In the current example, the pre-wired known value location of memory two corresponding to global PS pin 502 could be programmed with a two so that the comparator corresponding to memory two would issue an internal PS signal to the corresponding internal PS pin of memory two. In this manner, any of port of a stacked memory die may be selected by dropping the corresponding PS pin to active low in the manner illustrated in timing diagram 600 and described above.

Figure 7:
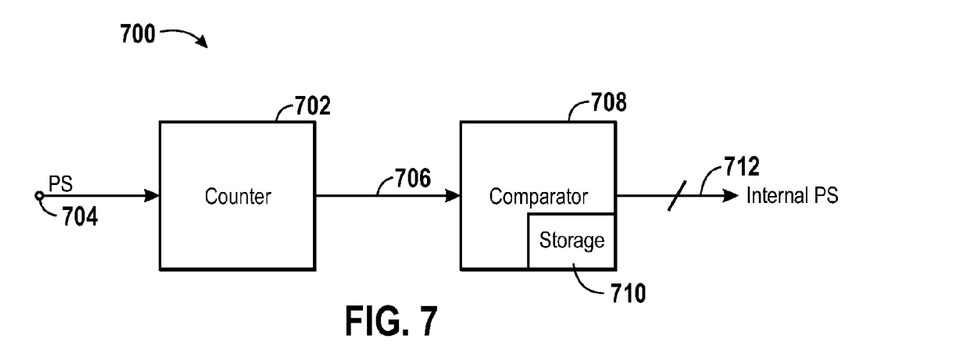
FIG. 7 is a block diagram of a second embodiment of a circuit used in selecting a single port of at least one memory die in a reduced I/O pin multi-port memory circuit.

FIG. 7 is a block diagram of a second embodiment utilizing a comparison circuit 700 to reduce the number of I/O pins used to select a single port of a memory die in a reduced I/O pin multi-port memory circuit. FIG. 7 illustrates a counter 702. Counter 702 has as an input a global PS signal issued from a global PS pin 704. Counter 702 counts the number of half-cycles that the global PS signal is driven low. Counter 702 may have a write strobe signal transmitted from a global write strobe pin as an input for use in counting the number of half-cycles that the global PS signal is driven low. Conversely, counter 702 may include internal clocking circuitry for counting the number of half-cycles that the global PS signal is driven low. The counter 702 issues a result of the counting operation on line 706. The value of the result issued by the counter 702 may be equivalent to the number of half-cycles that the global PS signal is driven low.

Comparator 708 receives the result issued by the counter 702 on line 706. Comparator 708 may include storage circuitry 710. The storage circuitry 710 may comprise a look-up table. The comparator 708 compares the result issued by the counter 702 on line 706 with the values in storage circuitry 710. The storage circuitry 710 may include information including numerical values matched to specific internal PS pins. For example, storage circuitry may include a table that correlates a zero value with a PS pin, such as PS pin 538, a one value with a second PS pin, such as PS pin 540, etc. As such, the comparator 708 determines which internal PS pin, such as 538-544, will receive an internal PS signal transmitted on internal PS bus 712. Internal PS bus 712 may include independent connections to each internal PS pin, such as, 538-544. Conversely, internal PS bus 712 may include shared lines.

Figure 8:
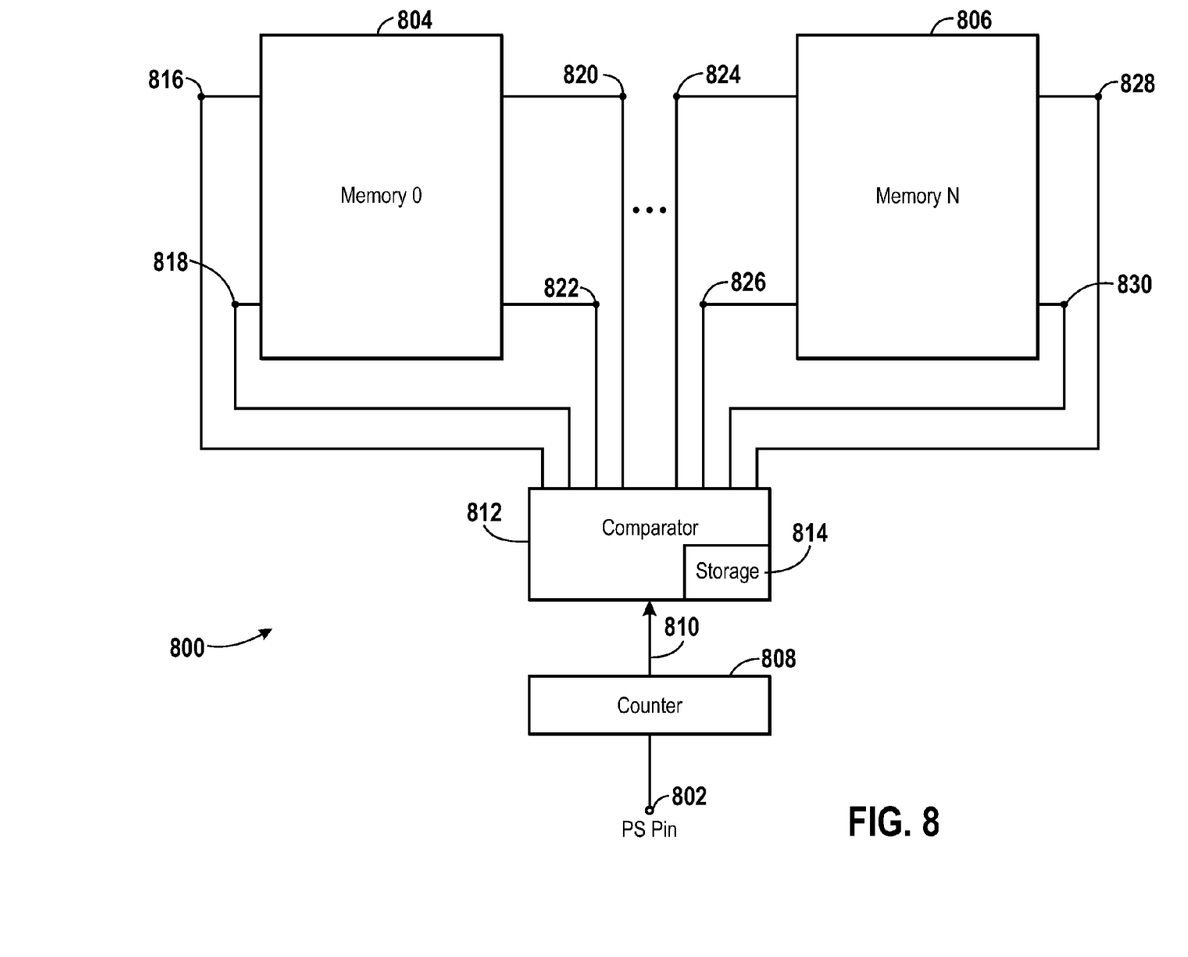
FIG. 8 is a block diagram illustrating a second embodiment of circuitry used in selecting a port in a reduced I/O pin multi-port memory circuit.

FIG. 8 is a block diagram 800 illustrating a second embodiment of circuitry used in selecting a port in a reduced I/O pin multi-port memory circuit. Block diagram 800 illustrates a global PS pin 802 used to select a specified port of a multi-port memory die, such as 804 or 806. Memory dies 804 (i.e., Memory 0) and 806 (i.e., Memory N) may include command address lines similar to those described with respect to memory die 504. Global PS pin 802 is an I/O pin which transmits an input signal to counter circuitry 808. Counter 808 counts the number of half-cycles that the global PS signal is driven low. Counter 808 may have a global write strobe signal transmitted from a global write strobe pin as an input for use in counting the number of half-cycles that the global PS signal is driven low. Conversely, counter 808 may include internal clocking circuitry for counting the number of half-cycles that the global PS signal is driven low. The counter 808 issues the results of the counting operations on line 810. The value of the result issued by the counter 808 may be equivalent to the number of half-cycles that the global PS signal is driven low.

Comparator 812 receives the result issued by the counter 808 on line 810. Comparator 812 may include storage circuitry 814. The storage circuitry 814 may comprise a look-up table. The comparator 812 compares the result issued by the counter 808 on line 810 with the values in storage circuitry 814. The storage circuitry 814 may include information including numerical values matched to specific internal PS pins. For example, storage circuitry may include a table that correlates a zero value with a PS pin, such as PS pin 816, a one value with a second PS pin, such as PS pin 818, etc. As such, the comparator 812 determines which internal PS pin, such as 816-830, will receive an internal PS signal across either independent connections to each internal PS pin, or shared lines. For example, if the global PS pin 802 issues an active low PS signal for one half-cycle of a write strobe signal, then comparator 812 would issue an internal PS signal to internal PS pin 816. In another example, memory die 806 may be the third memory in a memory stack with three dies. When global PS pin 802 issues an active low signal for eleven half-cycles of a write strobe signal, then comparator 812 would issue an internal PS signal to internal PS pin 828. PS pin 828 would be accessed because it would be the third pin on the third memory die, eleventh pin overall, thus would correspond to the eleven half-cycle active low signal described above. In this manner, any number of internal PS pins 816-830 may be accessed by a single global PS pin 802.

Thus, two examples of accessing multi-port memories from a single global PS pin have been described above. Through the use of multiple comparator circuits, shown in FIG. 5, internal PS pins 538-544 may be accessible by a single global PS pin 502. Similarly, through the use of a single comparator, as illustrated in FIG. 8, internal PS pins 816-830 were shown to be accessible by a single global PS pin 802. The use of a single global I/O pin used to access multiple memories is not limited to a global PS pin and multi-port memories. Indeed, it may be, for example, applied to a plurality of single input memory chips by way of a global chip select (CS) pin.

Figure 9:
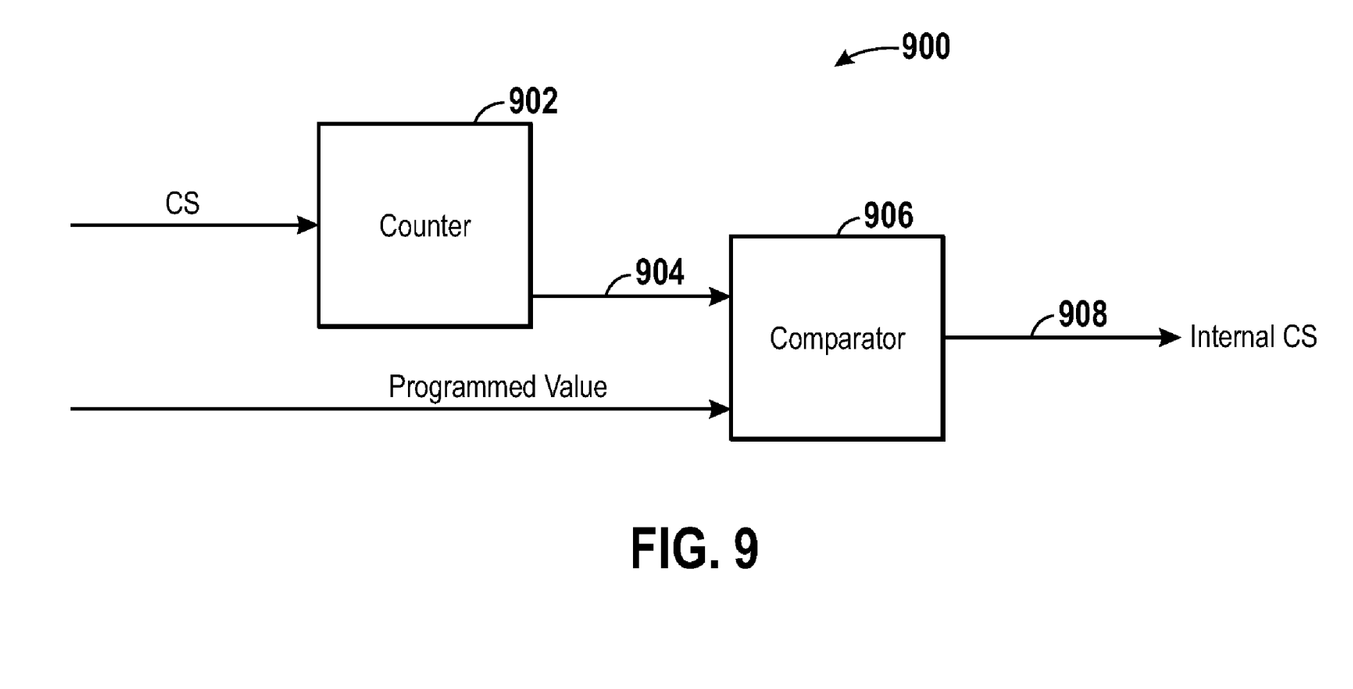
FIG. 9 is a block diagram of a first embodiment of a circuit used in selecting a memory die in a reduced I/O pin single-port memory circuit.

FIG. 9 is a block diagram of a first embodiment of a comparison circuit 900 used in selecting a single-port memory die in a reduced I/O pin single-port memory circuit with a global CS signal. FIG. 9 illustrates a counter 902. Counter 902 has as an input signal a CS signal issued from a global CS pin. Counter 902 counts the number of half-cycles that the CS signal is driven low. Counter 902 may have a write strobe signal transmitted from a global write strobe pin as an input for use in counting the number of half-cycles that the CS signal is driven low. Conversely, counter 902 may include internal clocking circuitry for counting the number of half-cycles that the CS signal is driven low. The counter 902 issues a result of the counting operation on line 904. The value of the result issued by the counter 902 may be equivalent to the number of half-cycles that the input CS signal is driven low. Comparator 906 receives the result issued by the counter 902 on line 904. Comparator 906 also receives a programmed value. The programmed value may be set according to a pre-wired known value. In one embodiment, the programmed value may be set according to a fuse. In another embodiment, the programmed value may be set by a signal on a wire bond pad, such as one that is connected to an external voltage source. Through regulation of this external voltage source, the value transmitted to the comparator may be adjusted to the desired programmed value. The comparator 906 compares the value issued by the counter 902 on line 904 with the programmed value. If the values are equivalent, then the comparator issues an internal CS signal on the internal CS line 908. Internal PS line 908 may be coupled to an internal CS pin of a memory die. Thus, in one embodiment, there is a one-to-one correspondence between comparison circuit 900 and the total number of internal CS pins.

Figure 10:
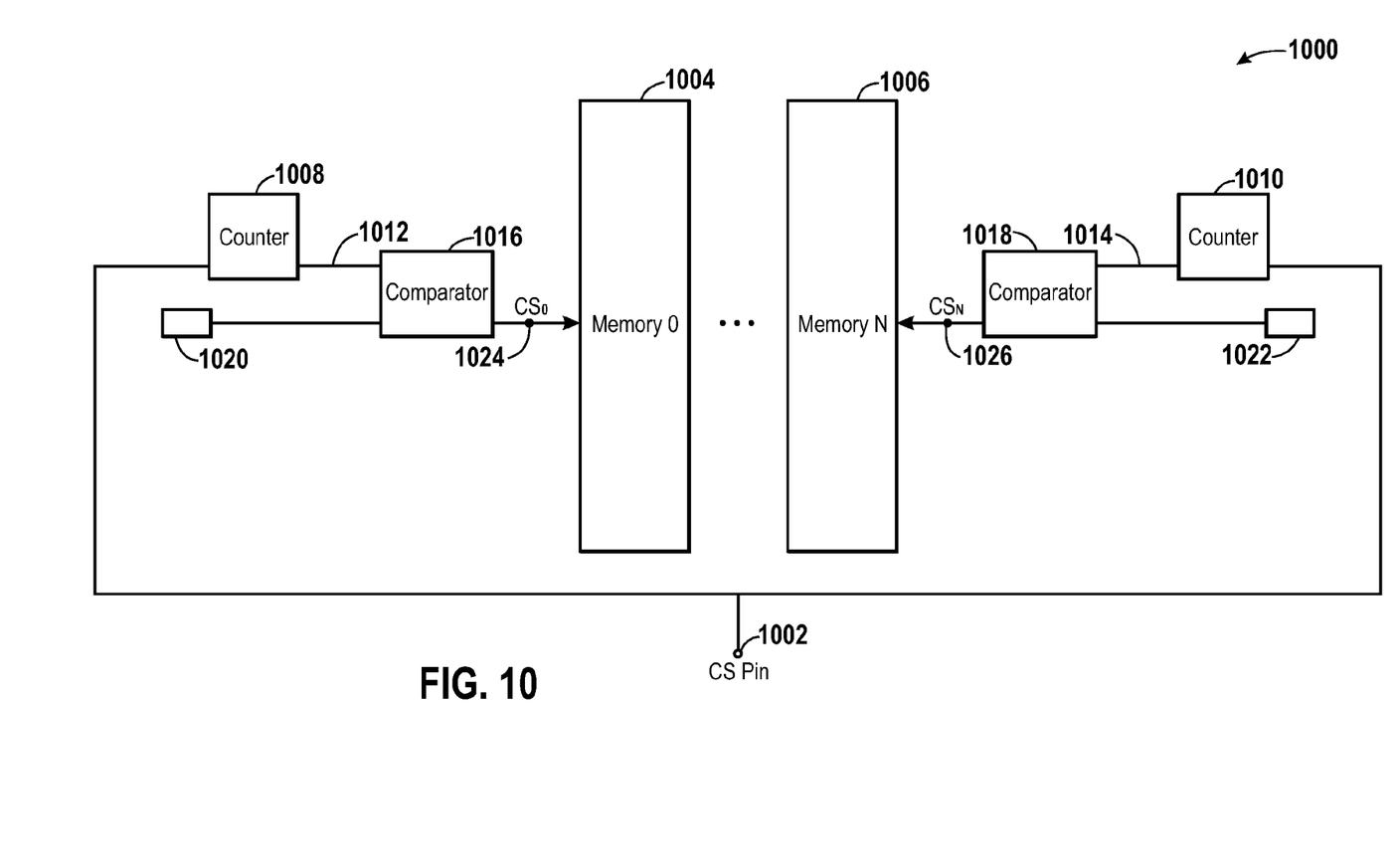
FIG. 10 is block diagram illustrating a first embodiment of circuitry used in selecting a memory die in a reduced I/O pin single-port memory circuit.

FIG. 10 is block diagram illustrating a first embodiment of circuitry 1000 used in selecting a memory die in a reduced I/O pin single-port memory circuit. FIG. 10 illustrates a global CS pin 1002 used to select a specific memory die 1004-1006 (i.e., Memory 0 and Memory N). Memory dies 1004-1006 may include command address lines similar to those described with respect to memory die 504. Global CS pin 1002 is an I/O pin which transmits an input signal to counter circuitry 1008-1010. Counters 1008-1010 count the number of half-cycles that the global CS signal is driven low. Counters 1008-1010 may have a global write strobe signal transmitted from a global write strobe pin as an input for use in counting the number of half-cycles that the global CS signal is driven low. Conversely, counters 1008-1010 may include internal clocking circuitry for counting the number of half-cycles that the global CS signal is driven low. The counters 1008-1010 issue the results of their counting operations on lines 1012-1014. The values of the results issued by the counters 1008-1010 may be equivalent to the number of half-cycles that the global CS signal is driven low. Comparators 1016-1018 receive the result issued by the counters 1008-1010 on lines 1012-1014. Comparators 1016-1018 also receive a programmed value issued from a pre-wired known value location 1020-1022. In one embodiment, the programmed value may be set according to a fuse. In another embodiment, the programmed value may be set by a signal on a wire bond pad. The comparators 1016-1018 compare the results issued by the counters 1008-1010 with the programmed values issued from pre-wired known value locations 1020-1022. If the values are equivalent, then the comparator 1016-1018 issues an internal CS signal to the corresponding internal CS pin 1024-1026. For example, if the global CS pin 1002 issues an active low CS signal for one half-cycle of a write strobe signal, then comparator 1016 would issue an internal CS signal (i.e., $CS_0$) to internal CS pin 1024. Similarly, if the global CS pin 1002 issues an active low CS signal for two half-cycles of a write strobe signal, then comparator 1018 would issue an internal CS signal (i.e., $CS_N$) to internal CS pin 1026 (assuming the memory rank was two). Thus, in this first embodiment, there is a one-to-one correspondence between the number of comparator circuits 1016-1018 and the total number of memory dies 1004-1006 to be selected by the global CS pin 1002, regardless of memory rank.

Figure 11:
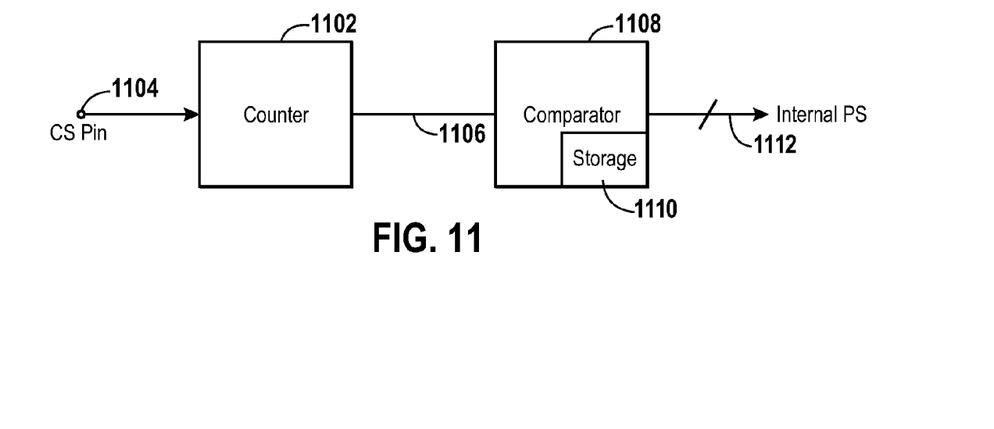
FIG. 11 is a block diagram of a second embodiment a circuit used in selecting a memory die in a reduced I/O pin single-port memory circuit.

FIG. 11 is a block diagram of a second embodiment of a circuit used in selecting a memory die in a reduced I/O pin single-port memory circuit. FIG. 11 illustrates a counter 1102. Counter 1102 has as an input a global CS signal issued from a global CS pin 1104. Counter 1102 counts the number of half-cycles that the global CS signal is driven low. Counter 1102 may have a write strobe signal transmitted from a global write strobe pin as an input for use in counting the number of half-cycles that the global CS signal is driven low. Conversely, counter 1102 may include internal clocking circuitry for counting the number of half-cycles that the global CS signal is driven low. The counter 1102 issues a result of the counting operation on line 1106. The value of the result issued by the counter 1102 may be equivalent to the number of half-cycles that the global CS signal is driven low.

Comparator 1108 receives the result issued by the counter 1102 on line 1106. Comparator 1108 may include storage circuitry 1110. The storage circuitry 1110 may comprise a look-up table. The comparator 1108 compares the result issued by the counter 1102 on line 1106 with the values in storage circuitry 1110. The storage circuitry 1110 may include information including numerical values matched to specific internal CS pins. For example, storage circuitry may include a table that correlates a zero value with a CS pin, such as CS pin 1024, a one value with a second CS pin, such as CS pin 1026, etc. As such, the comparator 1108 determines which internal CS pin, such as 1024-1026, will receive an internal CS signal transmitted on internal CS bus 1112. Internal CS bus 1112 may include independent connections to each internal CS pin, such as, 1024-1026. Conversely, internal CS bus 1112 may include shared lines.

Figure 12:
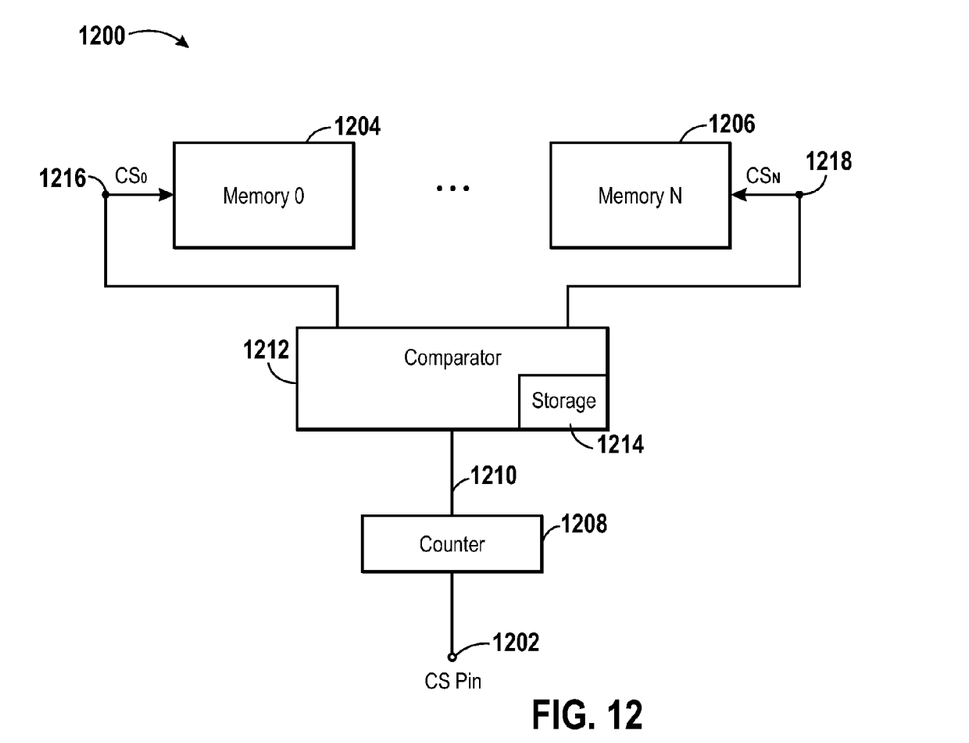
FIG. 12 is a block diagram illustrating a second embodiment of circuitry used in selecting a memory die in a reduced I/O pin single-port memory circuit.

FIG. 12 is a block diagram illustrating a second embodiment of circuitry used in selecting a memory die in a reduced I/O pin single-port memory circuit. Block diagram 1200 illustrates a global CS pin 1202 used to select a specified of a multi-port memory die, such as 1204 (i.e., Memory 0) or 1206 (i.e., Memory N). Memory dies 1204-1206 may include command address lines similar to those described with respect to memory die 504. Global CS pin 1202 is an I/O pin which transmits an input signal to counter circuitry 1208. Counter 1208 counts the number of half-cycles that the global CS signal is driven low. Counter 1208 may have a global write strobe signal transmitted from a global write strobe pin as an input for use in counting the number of half-cycles that the global CS signal is driven low. Conversely, counter 1208 may include internal clocking circuitry for counting the number of half-cycles that the global CS signal is driven low. The counter 1208 issues the results of the counting operations on line 1210. The value of the result issued by the counter 1208 may be equivalent to the number of half-cycles that the global CS signal is driven low.

Comparator 1212 receives the result issued by the counter 1208 on line 1210. Comparator 1212 may include storage circuitry 1214. The storage circuitry 1214 may comprise a look-up table. The comparator 1212 compares the result issued by the counter 1208 on line 1210 with the values in storage circuitry 1214. The storage circuitry 1214 may include information including numerical values matched to specific internal CS pins. For example, storage circuitry may include a table that correlates a zero value with a CS pin, such as CS pin 1216, a one value with a second CS pin, such as CS pin 1218, etc. As such, the comparator 1212 determines which internal CS pin, such as 1216-1218, will receive an internal CS signal across either independent connections to each internal CS pin, or shared lines. For example, if the global CS pin 1202 issues an active low CS signal for one half-cycle of a write strobe signal, then comparator 1212 would issue an internal CS signal (i.e., $CS_0$) to internal CS pin 1216. In another example, memory die 1206 may be the third memory in a memory stack with three dies. When global CS pin 1202 issues an active low signal for three half-cycles of a write strobe signal, then comparator 1212 would issue an internal CS signal (i.e., $CS_N$) to internal CS pin 1218. CS pin 1218 would be accessed because it would be the internal CS pin on the third memory die, third pin overall, thus would correspond to the third half-cycle active low signal described above. In this manner, any number of internal CS pins 1224-1226 may be accessed by a single global CS pin 802.

As described above, one or more embodiments of the invention allows for access to memory circuits through the use of only one external I/O pin. This external I/O pin may be a global PS pin, in the case of a multi-port memory, or it may be a global CS pin, in the case of a single port memory. Accordingly, while multiple internal pins may be required to access multiple memory circuits, only one external global I/O pin is required to interface with those same memory circuits. Indeed, by accessing the memories through a single external I/O pin, external pin counts may be kept to a minimum even as memory density increases. However, other configurations utilizing more than one external pin are also envisioned. For example, one could use a first external I/O pin for accessing a memory stack on one side of a PCB while using a second external I/O pin for accessing a memory stack on an opposite side of the PCB. It should be noted that while the description above was directed to I/O pins interfacing with memory dies, it is also envisioned that the I/O pins may also connect to a portion of the multi-port memory die, such as a port, or to a memory circuit.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A memory device comprising:
   a plurality of address pins;
   a plurality of internal port select pins;
   a plurality of comparator circuits, wherein each comparator circuit has a one-to-one correspondence with one of the plurality of port select pins and wherein each comparator circuit is adapted to transmit an internal port select signal to the corresponding port select pin; and
   a plurality of counter circuits, wherein each counter circuit has a one-to-one correspondence with one of the plurality of comparator circuits and wherein each counter circuit is adapted to transmit a count signal to the corresponding comparator circuit.

2. The memory device of claim 1, comprising a global select pin.

3. The memory device of claim 2, wherein each of the plurality of counter circuits is adapted to receive a global select signal from the global select pin.

4. The memory device of claim 1, wherein each of the plurality of comparator circuits is adapted to receive a respective programmed value.

5. The memory device of claim 4, comprising a plurality of fuses, wherein each of the programmed values is set according to a respective at least one of the plurality of fuses.

6. The memory device of claim 4, comprising a plurality of bond pads in a one-to-one correspondence with the plurality of comparator circuits, wherein each of the plurality of bond pads is adapted to provide the respective programmed value to the corresponding comparator circuit.

7. The memory device of claim 1, wherein the memory device comprises a memory die.

8. The memory device of claim 1, wherein the memory device comprises a first memory stack and a second memory stack.

9. The memory device of claim 8, wherein the first memory stack is on a first side of a circuit board, and wherein the second memory stack is on a second side of the circuit board.

10. The memory device of claim 9, comprising a first global select pin and a second global select pin, wherein the first global select pin is adapted to access the first memory stack, and wherein the second global select pin is adapted to access the second memory stack.

11. A method of accessing a memory comprising:
receiving a global select signal;
transmitting a first signal having a value to a comparator based on the global select signal;
comparing the first signal value with a programmed value; and
transmitting an internal select signal to a first memory when the first signal value and the programmed value associated with the first memory are equivalent.

12. The method of claim 11, wherein transmitting the internal select signal comprises transmitting the internal select signal to one of a plurality of port select inputs on the first memory based on a result of the comparison of the value of the first signal with the programmed value.

13. The method of claim 11, wherein transmitting an internal select signal comprises transmitting the internal select signal to one of a plurality of memory circuits when the first signal value and the programmed value associated with the one of a plurality of memory circuits are equivalent, wherein the plurality of memory circuits comprises a plurality of port inputs adapted to receive the transmitted internal select signal.

14. The method of claim 11, comprising retrieving the programmed value from storage circuitry in the comparator before comparing the first signal value with the programmed value.

15. The method of claim 14, wherein retrieving the programmed value comprises retrieving the programmed value from a look-up table.

16. A method of accessing a memory comprising:
receiving a global select signal at a first counter;
transmitting a first signal having a value from the first counter to a first comparator based on the global select signal;
comparing the first signal value with the second signal value, the second signal value corresponding to a programmed value; and
transmitting an internal select signal from the comparator to a first memory when the first signal value and the second signal value are equivalent.

17. The method of claim 6, comprising:
transmitting a third signal having a value from the second counter to a second comparator based on the global select signal;
comparing the third signal value and a fourth signal value at the second comparator, the fourth signal value corresponding to another programmed value; and
transmitting an internal select signal to the first memory when the third signal value and the fourth signal value are equivalent.

18. The method of claim 17, comprising:
transmitting a fifth signal having a value from the third counter to a third comparator based on the global select signal;
comparing the fifth signal value with a sixth signal value, the sixth signal value corresponding to a third programmed value; and
transmitting an internal select signal to a second memory when the fifth signal value and the sixth signal value are equivalent.

19. The method of claim 17, wherein the programmed value is set according to a fuse or a wire bond pad.

20. The method of claim 17, wherein receiving the global select signal comprises receiving a chip select signal.

* * * * *